US008901689B1

(12) United States Patent
Avouris et al.

(10) Patent No.: US 8,901,689 B1
(45) Date of Patent: Dec. 2, 2014

(54) GRAPHENE PHOTODETECTOR

(71) Applicant: International Business Machines Corporation, Armonk, NY (US)

(72) Inventors: Phaedon Avouris, Yorktown Heights, NY (US); Tony A. Low, Yorktown Heights, NY (US); Fengnian Xia, Plainsboro, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/891,940

(22) Filed: May 10, 2013

(51) Int. Cl.
 *H01L 27/14* (2006.01)
 *H01L 31/028* (2006.01)
 *H01L 31/0224* (2006.01)
 *H01L 31/18* (2006.01)

(52) U.S. Cl.
 CPC ...... *H01L 31/022408* (2013.01); *H01L 31/028* (2013.01); *H01L 31/1804* (2013.01)
 USPC ........................................ 257/428

(58) Field of Classification Search
 CPC ................................................ H01L 31/155
 USPC ................... 257/428, 659; 438/3, 57
 See application file for complete search history.

(56) References Cited

U.S. PATENT DOCUMENTS

| 5,525,828 | A | 6/1996 | Bassous et al. |
| 6,239,422 | B1 | 5/2001 | Vang et al. |
| 6,573,445 | B1 | 6/2003 | Burgers |
| 8,053,782 | B2 | 11/2011 | Avouris et al. |
| 8,110,883 | B2 * | 2/2012 | Ward et al. ............... 257/428 |
| 2012/0205518 | A1 | 8/2012 | Voutilainen et al. |
| 2013/0075688 | A1 * | 3/2013 | Xu et al. ..................... 257/4 |
| 2013/0170290 | A1 * | 7/2013 | Odagawa et al. ............ 365/158 |

OTHER PUBLICATIONS

X. Xu et al., "Photo-Thermoelectric Effect at a Graphene Interface Junction," Nano Lett., vol. 10, No. 2, Nov. 2009, pp. 562-566.
F. Xia et al., "Graphene nanophotoonics," 23rd Annual Meeting of the IEEE Photonics Society, Nov. 7-11, 2010, pp. 76-77.
T. Mueller et al., "Graphene photodetectors for high-speed optical communications," arXiv:1009, Sep. 22, 2010, 20 pages.
M. Freitag et al., "Photoconductivity of biased graphene," arXiv:1202, Feb. 23, 2012, 29 pages.
C.-H. Liu et al., "Evidence of Extraction of Photoexcited Hot Carriers from Graphene," arXiv:1203.5681, Mar. 26, 2012, 21 pages.
H. Yan et al., "Mid-infrared plasmons in scaled graphene nanostructures," arXiv:1209.1984, Sep. 10, 2012, 38 pages.

* cited by examiner

*Primary Examiner* — Quoc Hoang
(74) *Attorney, Agent, or Firm* — Scully, Scott, Murphy & Presser, P.C.; Vazken Alexanian

(57) ABSTRACT

A set of buried electrodes are embedded in a dielectric material layer, and a graphene layer having a doping of a first conductivity type are formed thereupon. A first upper electrode is formed over a center portion of each buried electrode. Second upper electrodes are formed in regions that do not overlie the buried electrodes. A bias voltage is applied to the set of buried electrodes to form a charged region including minority charge carriers over each of the buried electrodes, and to form a p-n junction around each portion of the graphene layer overlying a buried electrode. Charge carriers generated at the p-n junctions are collected by the first upper electrodes and the second upper electrodes, and are subsequently measured by a current measurement device or a voltage measurement device.

11 Claims, 4 Drawing Sheets

GRAPHENE PHOTODETECTOR

BACKGROUND

The present invention relates to an optoelectronic device, and particularly to a photodetector employing a sheet of graphene and methods of manufacturing and operating the same.

Two-dimensional carbon lattice structures include $sp^2$-bonded carbon atoms that are densely packed in a hexagonal lattice structure. If the two-dimensional carbon lattice structure is topologically planar, the two-dimensional carbon lattice structure constitutes a graphene layer. A graphene layer absorbs and emits light across the entire range of the electromagnetic spectrum, and sustains high electrical current densities and extreme temperatures. Despite the superior performance potential of a graphene relative to silicon and group III-V semiconductor compounds in terms of such properties, formation of a compact optoelectronic device based on a graphene is a significant challenge because coupling between electromagnetic radiation and charge carriers of the graphene layer is relatively weak and because the charge carrier lifetime in a graphene layer is relatively short.

BRIEF SUMMARY

A photodetector based on a graphene layer can provide high efficiency by geometrically arranging a plurality of electrodes to minimize travel distances for charge carriers generated by photons. The photodetector utilizes both photovoltaic effects and photo-thermo-electric (PTE) effects to enhance the photoresponse of a graphene-based photodetector.

A set of buried electrodes are embedded in a dielectric material layer, and a graphene layer having a doping of a first conductivity type is formed thereupon. A first upper electrode is formed over a center portion of each buried electrode. Second upper electrodes are formed in regions that do not overlie the buried electrodes. A bias voltage is applied to the set of buried electrodes to form a charged region including minority charge carriers over each of the buried electrodes, and to form a p-n junction around each portion of the graphene layer overlying a buried electrode. Charge carriers generated at the p-n junctions are collected by the first upper electrodes and the second upper electrodes, and are subsequently measured by a current measurement device or a voltage measurement device.

Multiple p-n junctions are formed in a graphene layer such that the p-n junctions are located within multiple pairs of metallic fingers of different types. The response of the photodetector of the present invention is due to the photovoltaic and photothermoelectric effect at the p-n junctions in the graphene layer. These two effects produces a photocurrent in the same direction. The three effects result in electrical currents that flow along a same direction, thereby proving a greater photocurrent than a component of the electrical current due to the photovoltaic effect only. The location of the p-n junctions can be optimized by adjusting the magnitude of electrical bias applied to the buried electrodes. The lengths of the first and second upper electrodes and the buried electrodes can also be optimized to enhance the photoresponse of the device. Further, the device of the present invention can be integrated into standard semiconductor manufacturing schemes to provide low cost electromagnetic radiation detectors.

According to an aspect of the present invention, an electromagnetic radiation detector is provided, which includes at least one buried electrode embedded in an insulator layer, a graphene layer overlying the insulator layer, and at least one first upper electrode. Each of the at least one first upper electrode has a pair of sidewalls that overlie a top surface of one of the at least one buried electrode. The electromagnetic radiation detector further includes at least one second upper electrode that does not overlie, and is laterally offset from sidewalls of, the at least one buried electrode. In addition, a measurement circuitry is configured to measure an electrical current between, or an electrical voltage across, the at least one first upper electrode and the at least one second upper electrode.

According to another aspect of the present invention, a method of forming an electromagnetic radiation detector is provided. At least one buried electrode is formed in an insulator layer. A graphene layer is formed over the insulator layer. At least one first upper electrode is formed. Each of the at least one first upper electrode has a pair of sidewalls that overlie a top surface of one of the at least one buried electrode. At least one second upper electrode is formed. The at least one second upper electrode does not overlie, and is laterally offset from sidewalls of, the at least one buried electrode. A measurement circuitry is formed, which is configured to measure an electrical current between, or an electrical voltage across, the at least one first upper electrode and the at least one second upper electrode.

DETAILED DESCRIPTION

Figure 1:
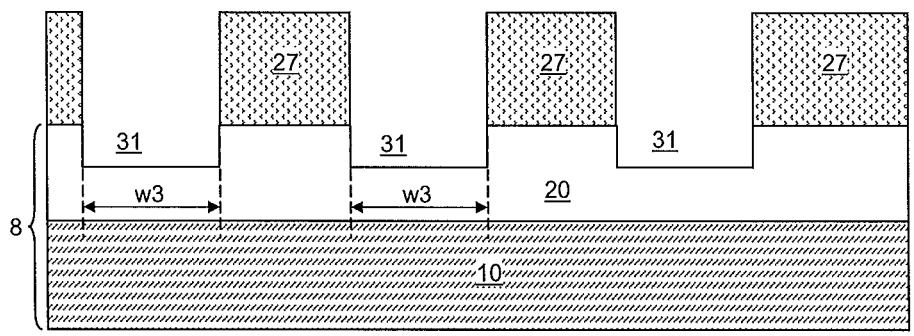
FIG. 1 is a vertical cross-sectional view of an exemplary structure after formation of trenches in an insulator layer according to an embodiment of the present invention.

As stated above, the present invention relates to a photodetector employing a sheet of graphene and methods of manufacturing and operating the same. Aspects of the present invention are now described in detail with accompanying figures. It is noted that like reference numerals refer to like elements across different embodiments. As used herein, ordinals such as "first" and "second" are employed merely to distinguish similar elements, and different ordinals may be employed to designate a same element in the specification and/or claims.

Referring to FIG. 1, an exemplary structure according to an embodiment of the present invention includes a substrate 8, which includes a stack of a handle substrate 10 and an insulator layer 20. The handle substrate 10 can include a semiconductor material, a dielectric material, or a conductive material, and provides mechanical support to the insulator layer 20 and the structures to be formed thereupon. The insulator layer 20 includes a dielectric material such as silicon oxide, silicon nitride, or another dielectric material. The thickness of the insulator layer 20 can be in a range from 100 nm to 1,000 nm, although lesser and greater thicknesses can also be employed.

Trenches 31 are formed in the insulator layer 20, for example, by application of a photoresist layer 27, formation of line-shaped openings within the photoresist layer 27, and transfer of the pattern into the insulator layer 20 by an etch that employs the photoresist layer 27 as an etch mask. As used herein, a "line-shaped opening" refers to an opening defined by a periphery including a pair of lengthwise edges that are parallel to each other. As used herein, a "lengthwise edge" refers to an edge that is parallel to a longest edge of a shape. The etch can be an anisotropic etch such as a reactive ion etch, or can be an isotropic etch such as a wet etch. In one embodiment, the etch can be an anisotropic etch. The depth of the trenches 31 can be in a range from 30 nm to 1,000 nm, although lesser and greater depths can also be employed. In one embodiment, the peripheries of the trenches 31 coincide with the peripheries of the openings in the photoresist layer 27.

Each trench 31 can have a pair of sidewalls that are laterally spaced by a width, which is herein referred to as a third width w3. The third width w3 can be in a range from 50 nm to 5,000 nm, although lesser and greater third widths can also be employed. The distance between neighboring trenches 31 can be in a range from 50 nm to 2,000 nm, although lesser and greater distances can also be employed. The horizontal direction along which the lengthwise sidewalls of the trenches 31 extend is herein referred to as a lengthwise direction of the trenches 31. The photoresist layer 27 is subsequently removed, for example, by ashing.

Figure 2:
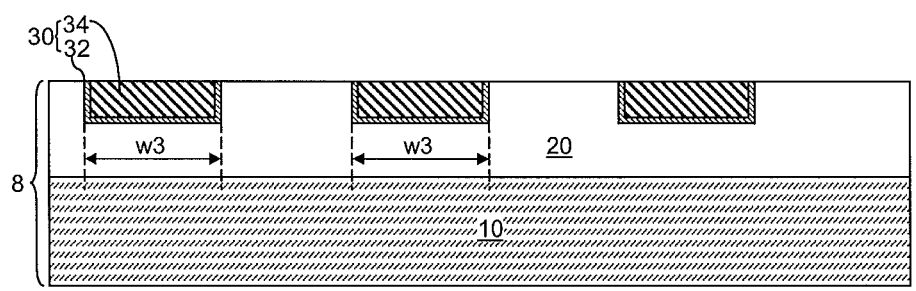
FIG. 2 is a vertical cross-sectional view of the exemplary structure after formation of buried electrodes according to an embodiment of the present invention.

Referring to FIG. 2, buried electrodes 30 are formed by filling the trenches 31 with at least one conductive material and by removing portions of the at least one conductive material from above the horizontal plane including the top surface of the insulator layer 20. For example, a metallic layer and a metallic fill material layer can be sequentially deposited in the trenches 31 and over the top surface of the insulator layer 20, and can be planarized to remove portions of the metallic fill material layer and the metallic layer from above a horizontal plane including the top surface of the insulator layer 20.

The planarization of the metallic fill material layer and the metallic layer can be performed, for example, by chemical mechanical planarization (CMP). Remaining portions of the at least one conductive material constitute the buried electrodes 30. The remaining portions of the metallic layer constitute metallic liners 32, and the remaining portions of the metallic fill material layer constitute conductive fill material portions 34. Each buried electrode 30 can include a metallic liner 32 and a conductive fill material portion 34. The metallic liner 32 and the conductive fill material portion 34 in each buried electrode 32 can have top surfaces that are coplanar with the top surface of the insulator layer 20. Each buried electrode 30 is embedded in the insulator layer 20.

The metallic liners 32 can include a metallic material that promotes adhesion to the surfaces of the insulator layer 20. For example, the metallic liners 32 can include a metallic nitride such as TiN, TaN, and WN. The thickness of the metallic liners 32 can be in a range from 1 nm to 10 nm, although lesser and greater thicknesses can also be employed. The conductive fill material portions 34 can include any metallic material. For example, the conductive fill material portions 34 can include an elemental metal or an intermetallic alloy such as Au, Ag, Ti, Ta, Al, Cu, Pt, and alloys thereof.

Each buried electrode 30 includes a pair of sidewalls that extends along the lengthwise direction of the buried electrode 30. The lengthwise direction is a horizontal direction that is perpendicular to the spacing between neighboring buried electrodes 30. A metallic liner 32 in each buried electrode 30 contacts sidewalls and a recessed surface of the insulator layer 20. A conductive fill material portion 34 in each buried electrode 30 has a top surface that is coplanar with the top surface of the insulator layer 20.

Figure 3:
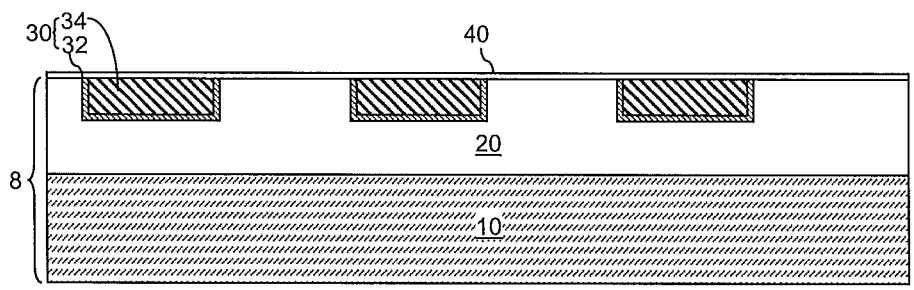
FIG. 3 is a vertical cross-sectional view of the exemplary structure after placement of a graphene layer on the top surface of the insulator layer according to an embodiment of the present invention.

Referring to FIG. 3, a graphene layer 40 is placed on the top surface of the insulator layer 20. The graphene layer 40 can be provided by any known method in the art. For example, the graphene layer 40 can be provided by exfoliation, sonication of graphite, reduction of graphite oxide, or epitaxial growth on a single crystalline substrate and separation. The graphene layer 40 thus provided is subsequently disposed on the top surface of the insulator layer 20.

In one embodiment, the graphene layer 40 as provided is doped with electrical dopants at a dopant concentration in a range from $1.0 \times 10^{14}/m^2$ to $1.0 \times 10^{18}/m^2$. The conductivity type of the electrical dopants in the graphene layer 40 is herein referred to as a first conductivity type, which can be p-type or n-type. Thus, the graphene layer 40 as a doping of the first conductivity type. The graphene layer 40 can be a single layer of a graphene sheet. The graphene layer 40 can contact the entirety of the top surfaces of the buried electrodes 30 and the top surface of the insulator layer 20.

Figure 4:
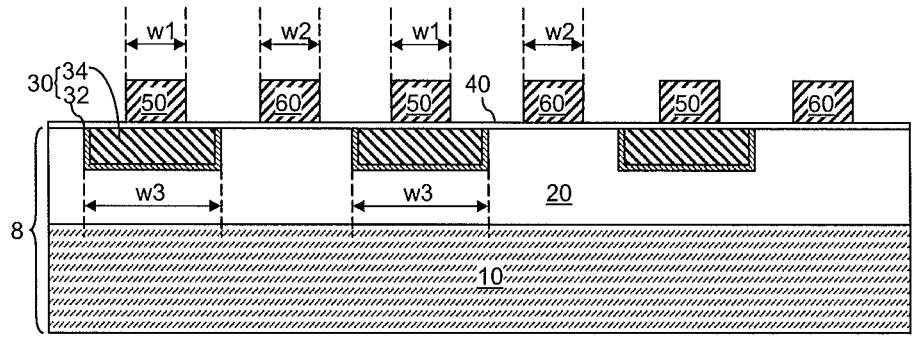
FIG. 4 is a vertical cross-sectional view of the exemplary structure after forming of first upper electrodes and second upper electrodes according to an embodiment of the present invention.

Referring to FIG. 4, first upper electrodes 50 and second upper electrodes 60 are formed on the graphene layer 40. The first upper electrodes 50 are formed within areas of the buried electrodes 30, and the second upper electrodes 60 are formed outside areas of the buried electrodes 30. Each first upper electrode 50 has a pair of sidewalls that overlie a top surface of a buried electrode 30. As used herein, an element "overlies" a surface if the entirety of the element is located above a two-dimensional plane including the surface and if the entirety of the element is present within an area defined by the periphery of the surface. Each second upper electrode 60 does not overlie, and is laterally offset from sidewalls of, the buried electrodes. In other words, the areas of the second upper electrodes 60 do not overly with any area of the buried electrodes 60.

The first upper electrodes 50 and the second upper electrodes 60 include a metallic material, which can be, for example, Au, Ag, Ti, Ta, Al, Cu, Pt, and alloys thereof. The first upper electrodes 50 and the second upper electrodes 60 can be simultaneously formed by a masked directional deposition of a conductive material. As used herein, a "masked directional deposition" refers to a directional deposition of a material employing a patterned mask. Methods for the directional deposition of a conductive material include vacuum evaporation, sputtering, molecular beam deposition, or any other deposition method that provides a directional path for a beam of conductive molecules or conductive particles. The mask employed to block the directional path of the beam determines the areas in which the first upper electrodes 50 and the second upper electrodes 60 are formed. For example, the mask can have openings in areas corresponding to the areas of the first upper electrodes 50 and the second upper electrodes 60.

In one embodiment, the first upper electrodes 50 and the second upper electrodes 60 can include different conductive materials. In this case, the first upper electrodes 50 and the second upper electrodes 60 can be formed by separate masked deposition processes.

Alternately, the first upper electrodes 50 and the second upper electrodes 60 can be formed by deposition of a metallic material and subsequent patterning of the metallic material. In this case, an etch chemistry employed to pattern the deposited metallic material can be selective to carbon in order to avoid damaging the graphene layer 40.

Each first upper electrode 50 can have a pair of parallel sidewalls separated by a first width w1, i.e., can have a uniform width that is the same as the first width w1. The first width w1 can be in a range from 25 nm to 1,000 nm, although lesser and greater first widths can also be employed. Each second upper electrode 60 can have a pair of sidewalls separated by a second width w2, i.e., can have a uniform width that is the same as the second width w2. The second width w2 can be in a range from 25 nm to 1,000 nm, although lesser and greater second widths can also be employed. The parallel sidewalls of the first upper electrodes 50 can extend along the lengthwise direction, i.e., the horizontal direction along which the buried electrodes 30 laterally extend. Likewise, the parallel sidewalls of the second upper electrodes 60 can extend along the lengthwise direction.

In one embodiment, a plurality of first upper electrodes 50 and a plurality of second upper electrodes 60 can be interlaced to provide an alternating arrangement of first and second upper electrodes (50, 60) along a horizontal direction. In other words, the first upper electrodes 50 and the second upper electrodes 60 can alternate along the horizontal direction that is perpendicular to the lengthwise direction. In this case, a vertical plane including a sidewall of a buried electrode 30 can exist between each neighboring pair of a first upper electrode 50 and a second upper electrode 60. The parallel sidewalls of the first and second upper electrodes (50, 60) can be perpendicular to spacings between neighboring pairs of a first upper electrode 50 and a second upper electrode 60.

Figure 5:
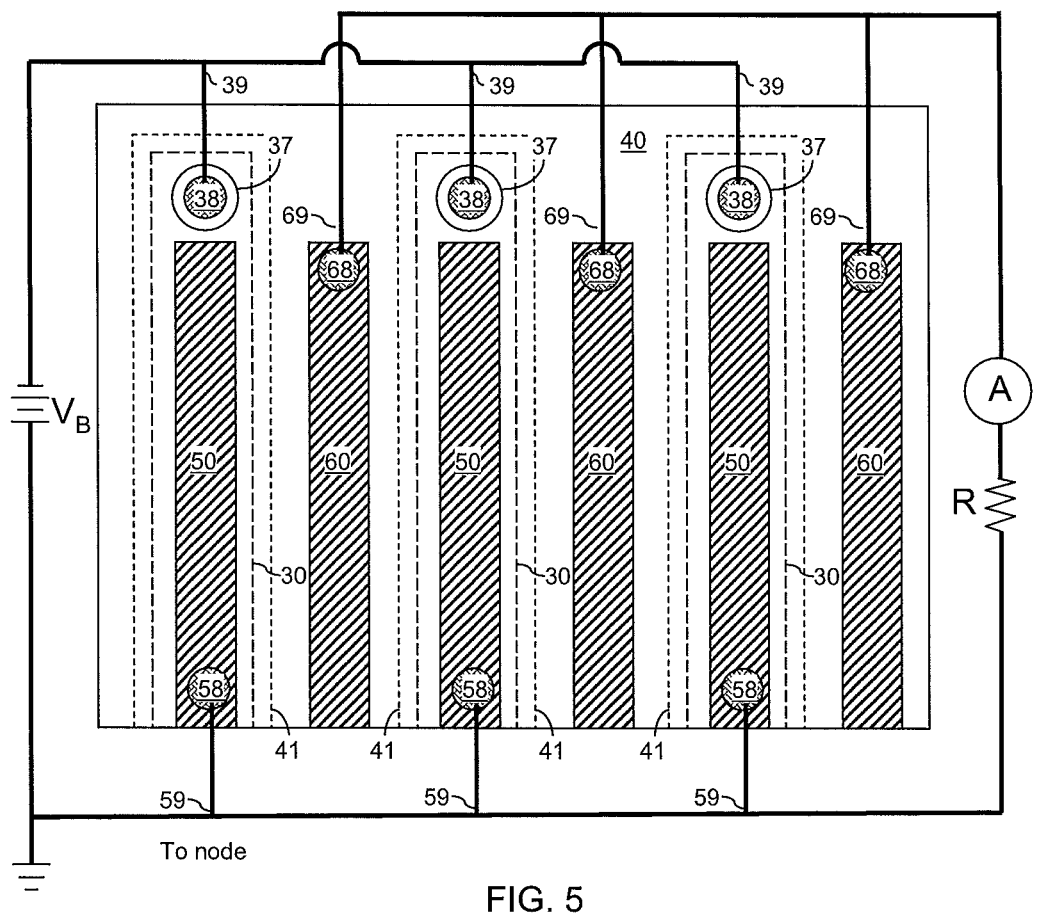
FIG. 5 is a schematic view of the exemplary structure after formation of contact structures and electrical wiring for a bias circuitry and a measurement circuitry according to an embodiment of the present invention.

Referring to FIG. 5, various contact structures are formed on the buried electrodes 30, the first upper electrodes 50, and the second upper electrodes 60. The various contact structures include buried electrode contact structures 38 that are formed directly on the buried electrodes 30, first electrode contact structures 58 that are formed directly on first upper electrodes 50, and second electrode contact structures 68 that are formed directly on second upper electrodes 60. Holes 37 can be made through the graphene layer 40 to prevent electrical shorts between the buried electrode contact structures 38 and the graphene layer 40. The various contact structures (38, 58, 68) can be solder balls, patterned metallic pads, or contact via structures formed within a dielectric material layer that is deposited over the first and second upper electrodes (50, 60) and the graphene layer 40.

Electrical wirings are attached to the various contact structures (38, 58, 68) to provide a bias circuitry and a measurement circuitry. The electrical wiring can include buried-electrode-side electrical wiring 39 that is electrically connected (i.e., electrically shorted) to the buried electrodes 30 through the buried electrode contact structures 38, first-electrode-side electrical wiring 59 that is electrically connected to the first upper electrodes 50 through the first electrode contact structures 58, and second-electrode-side electrical wiring 69 that is electrically connected to the second upper electrodes 60 through the second electrode contact structures 68.

The bias circuitry is configured to electrically bias the buried electrodes 30 relative to the first upper electrodes 50 or relative to the second upper electrodes 60. The node relative to which an electrical bias voltage $V_B$ is applied to the buried electrodes 30 is herein referred to as a reference node. In one embodiment, the reference node may be electrically grounded. Application of the electrical bias voltage $V_B$ to the buried electrodes 30 can be performed by a battery or any other constant voltage source known in the art.

Charge carriers are formed in regions of the graphene layer 40 that overlie the buried electrodes by applying an electrical bias to the buried electrodes. Specifically, the polarity and the magnitude of the electrical bias voltage $V_B$ can be selected such that minority charge carriers are provided in regions of the graphene layer 40 that overlie the buried electrodes 30. The induced charge carriers have a conductivity type that is the opposite of the conductivity type of the dopants in the graphene layer 40 as provided on the insulator layer 20 prior to application of the electrical bias.

As discussed above, the graphene layer 40 is doped with dopants of the first conductivity type, and thus, predominant charge carriers in the graphene layer 40 are charge carriers of the first conductivity type. If the first conductivity type is p-type, the majority charge carriers in the graphene layer 40 are p-type charge carriers, i.e., holes, and if the first conductivity type is n-type, the majority charge carriers in the graphene layer 40 are n-type charge carriers, i.e., electrons. The conductivity type that is the opposite of the first conductivity type is herein referred to as a second conductivity type. If the first conductivity type is p-type, the second conductivity type is n-type, and vice versa. Thus, the minority charge carriers provided in regions of the graphene layer 40 that overlie the buried electrodes 30 are holes if the graphene layer 40 as provided at the step of FIG. 3 is n-doped, or electrons if the graphene layer 40 as provided at the step of FIG. 3 is p-doped.

P-n junctions 41 are formed within the graphene layer 40 by the application of the electrical bias voltage $V_B$ to the buried electrodes 30. Each p-n junction 41 does not overlie any of the buried electrodes 30. Each p-n junction 41 is laterally offset from a sidewall of a most proximate buried electrode among the buried electrodes 30.

A depletion region is formed around each p-n junction 40, in which free charge carriers are not present and electrical field is present. Photogeneration of a pair of an electron and a hole occurs upon illumination of the graphene layer 40. If the photogeneration of the electron-hole pair occurs in regions in which the electrical field is non-zero, the electron and the hole are separated without recombination. One of the electron and the hole is pulled toward a most proximate first upper electrode 50, and the other of the electron and the hole is puller toward a most proximate second upper electrode 60. The direction of the electrical field in the depletion region determines the direction along which the electron or the hole is transported.

A measurement circuitry is provided to measure the electrical current or the electrical voltage across the first upper electrodes 50 and the second upper electrodes 60. The measurement circuitry can be configured to measure an electrical current between, or an electrical voltage across, the first upper electrodes 50 and the second upper electrodes 60. A plurality of first upper electrodes 50 can be electrically shorted to provide a first node, and a plurality of second upper electrodes 60 can be electrically shorted to provide a second node. Any measurement circuitry configured to measure an electrical current between the first node and the second node may be employed. For example, the measurement circuitry can include a series connection of an ammeter and a load (such as a resistor R) as illustrated in FIG. 5. Any of the first node and the second node can be the reference node, which may be electrically shorted.

Figure 6:
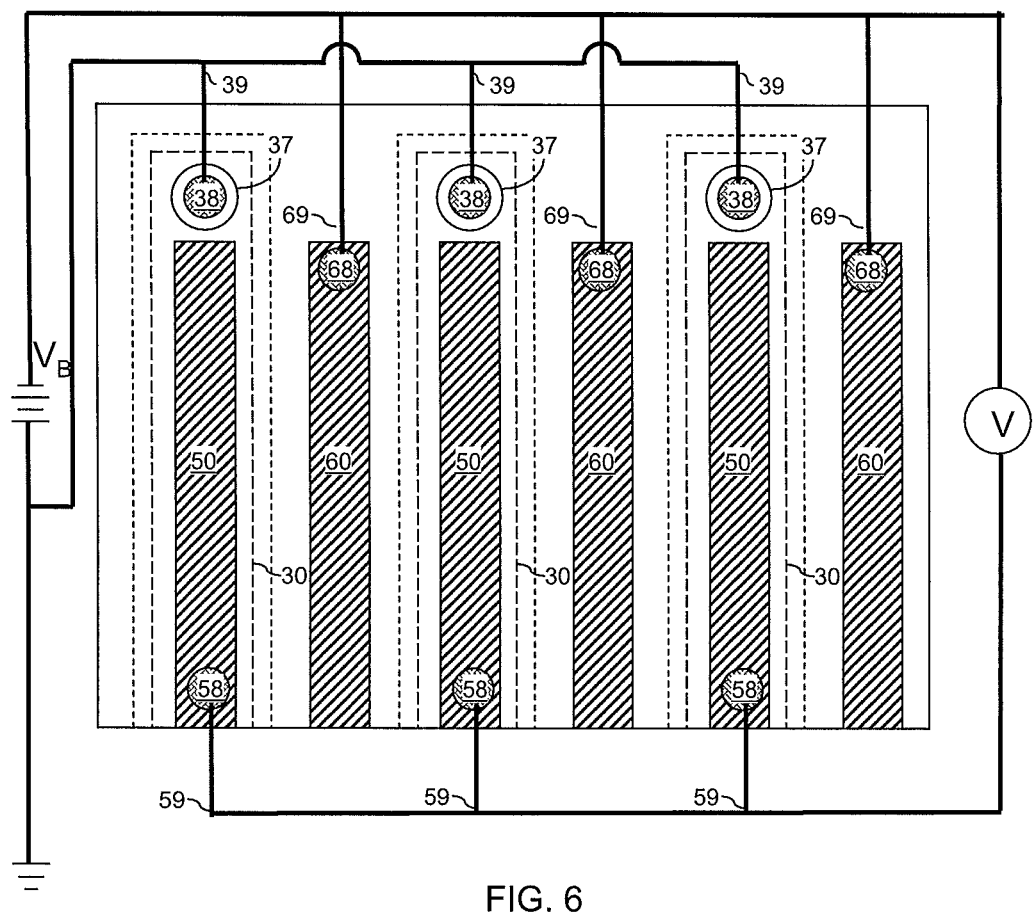
FIG. 6 is a schematic view of a variation of the exemplary structure after formation of contact structures and electrical wiring for a bias circuitry and a measurement circuitry according to an embodiment of the present invention.

Alternately, the measurement circuitry can include a voltmeter. The measurement circuitry can be configured to measure the open circuit voltage as illustrated in FIG. 6, or a finite electrical load (not shown) such as a resistor may be added across the first node and the second node. Any of the first node and the second node can be the reference node, which may be electrically shorted.

The magnitude of the bias voltage across the buried electrodes 30 and the reference node can be selected such that the lateral offset of p-n junctions 41 from a most proximate sidewall of the buried electrodes 30 can be in a range of 3 nm to 30 nm. An electrical bias voltage in a range from 0.5 V to 5 V can be employed, although lesser and greater electrical bias voltages can also be employed.

The first upper electrodes 50 and the second upper electrodes 60 are geometrically arranged to minimize travel distances for charge carriers generated by photons. Further, the photodetector utilizes both photovoltaic effects and photo-thermo-electric (PTE) effects to enhance the photoresponse of a graphene-based photodetector.

Charge carriers generated at the p-n junctions 41 are collected by the first upper electrodes 50 and the second upper electrodes 60, and are subsequently measured by a current measurement device or a voltage measurement device. Multiple p-n junctions 41 are formed in the graphene layer 40 such that the p-n junctions 41 are located within multiple pair of metallic fingers of different types, i.e., metallic fingers of a first type that include the first upper electrodes 50 and metallic fingers of a second type that include the second upper electrodes 60. The response of the photodetector of the present invention is due to the photovoltaic effect at the p-n junctions 41 in the graphene layer 40, the photo-thermo-electric effect at the material junctions between each first upper electrode 50 and an underlying region of the graphene layer 40 including charge carriers of the second conductivity type (which are induced by the electrical bias applied to the buried electrodes 30), and the photo-thermo-electric effect at the material junctions between each second upper electrode 60 and an underlying region of the graphene layer 40 including charge carriers of the first conductivity type (i.e., the majority charge carriers). The three effects result in electrical currents that flow along a same direction, thereby proving a greater photocurrent than a component of the electrical current due to the photovoltaic effect only. The location of the p-n junctions 41 can be optimized by adjusting the magnitude of electrical bias applied to the buried electrodes 50. The lengths of the first and second upper electrodes (50, 60) and the buried electrodes 30 can also be optimized to enhance the photoresponse of the device. Further, the device of the present invention can be integrated into standard semiconductor manufacturing schemes to provide low cost electromagnetic radiation detectors.

While the invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly disclosed otherwise or otherwise impossible as would be known to one of ordinary skill in the art. Accordingly, the invention is intended to encompass all such alternatives, modifications and variations which fall within the scope and spirit of the invention and the following claims.

What is claimed is:

1. An electromagnetic radiation detector comprising:
   at least one buried electrode embedded in an insulator layer;
   a graphene layer overlying said insulator layer, wherein said graphene layer is doped with electrical dopants at a dopant concentration in a range from $1.0 \times 10^{14}/m^2$ to $1.0 \times 10^{18}/m^2$;
   at least one first upper electrode, wherein each of said at least one first upper electrode has a pair of sidewalls that overlie a top surface of one of said at least one buried electrode;
   at least one second upper electrode that does not overlie, and is laterally offset from sidewalls of, said at least one buried electrode; and
   a measurement circuitry configured to measure an electrical current between, or an electrical voltage across, said at least one first upper electrode and said at least one second upper electrode.

2. The electromagnetic radiation detector of claim 1, wherein each of said at least one buried electrode includes a pair of sidewalls that extends along a lengthwise direction that is perpendicular to a spacing between one of said at least one first upper electrode and one of said at least one second upper electrode.

3. The electromagnetic radiation detector of claim 1, wherein one of said at least one first upper electrode has a pair of parallel sidewalls separated by a first width and extending along a lengthwise direction, and one of said at least one second upper electrode has a pair of sidewalls separated by a second width and extending along said lengthwise direction.

4. The electromagnetic radiation detector of claim 3, wherein a vertical plane including a sidewall of one of said at least one buried electrode exists between each neighboring pair of a first upper electrode and a second upper electrode.

5. The electromagnetic radiation detector of claim 1, wherein said at least one first upper electrode is a plurality of first upper electrodes, said at least one second upper electrode is a plurality of second upper electrodes, and said plurality of first upper electrodes and said plurality of second upper electrodes are interlaced to provide an alternating arrangement of first and second upper electrodes along a horizontal direction.

6. The electromagnetic radiation detector of claim 1, wherein said graphene layer has a doping of a first conductivity type and said at least one buried electrode is electrically biased to provide charge carriers of a second conductivity type in regions of said graphene layer that overlie said at least one buried electrode, wherein said second conductivity type is the opposite of said first conductivity type.

7. The electromagnetic radiation detector of claim 1, further comprising at least one p-n junction within said graphene layer, wherein one of said at least one p-n junction does not overlie, and is laterally offset from a sidewall of, one of said at least one buried electrode.

8. The electromagnetic radiation detector of claim 1, further comprising a bias circuitry configured to electrically bias said at least one buried electrode relative to said at least one first upper electrode or relative to said at least one second upper electrode.

9. The electromagnetic radiation detector of claim 1, wherein each of said at least one buried electrode comprises:
   a metallic liner contacting sidewalls and a recessed surface of said insulator layer; and
   a conductive fill material portion having a top surface that is coplanar with a top surface of said insulator layer.

10. An electromagnetic radiation detector comprising:
    at least one buried electrode embedded in an insulator layer;

a graphene layer overlying said insulator layer, wherein said graphene layer has a doping of a first conductivity type and said at least one buried electrode is electrically biased to provide charge carriers of a second conductivity type in regions of said graphene layer that overlie said at least one buried electrode, wherein said second conductivity type is the opposite of said first conductivity type;

at least one first upper electrode, wherein each of said at least one first upper electrode has a pair of sidewalls that overlie a top surface of one of said at least one buried electrode;

at least one second upper electrode that does not overlie, and is laterally offset from sidewalls of, said at least one buried electrode; and a measurement circuitry configured to measure an electrical current between, or an electrical voltage across, said at least one first upper electrode and said at least one second upper electrode.

11. An electromagnetic radiation detector comprising:

at least one buried electrode embedded in an insulator layer;

a graphene layer overlying said insulator layer, wherein at least one p-n junction is located within said graphene layer, and said at least one of said at least one p-n junction does not overlie, and is laterally offset from a sidewall of, one of said at least one buried electrode;

at least one first upper electrode, wherein each of said at least one first upper electrode has a pair of sidewalls that overlie a top surface of one of said at least one buried electrode;

at least one second upper electrode that does not overlie, and is laterally offset from sidewalls of, said at least one buried electrode; and a measurement circuitry configured to measure an electrical current between, or an electrical voltage across, said at least one first upper electrode and said at least one second upper electrode.

* * * * *